United States Patent
Kim et al.

(10) Patent No.: US 8,265,218 B2
(45) Date of Patent: Sep. 11, 2012

(54) PHASE DETECTION CIRCUIT

(75) Inventors: Yong Ju Kim, Ichon (KR); Kun Woo Park, Ichon (KR); Jong Woon Kim, Ichon (KR); Hee Woong Song, Ichon (KR); Ic Su Oh, Ichon (KR); Hyung Soo Kim, Ichon (KR); Tae Jin Hwang, Ichon (KR)

(73) Assignee: SK hynix Inc. (KR)

( * ) Notice: Subject to any disclaimer, the term of this patent is extended or adjusted under 35 U.S.C. 154(b) by 795 days.

(21) Appl. No.: 12/018,770

(22) Filed: Jan. 23, 2008

(65) Prior Publication Data

US 2009/0041172 A1 Feb. 12, 2009

(30) Foreign Application Priority Data

Aug. 10, 2007 (KR) .................. 10-2007-0080621

(51) Int. Cl.
*H04L 25/00* (2006.01)
(52) U.S. Cl. .......................................... 375/375
(58) Field of Classification Search .......... 375/354, 375/371, 375, 376
See application file for complete search history.

(56) References Cited

U.S. PATENT DOCUMENTS

| 5,459,416 | A   | * | 10/1995 | Ghia et al. .......... 327/34 |
| 5,889,437 | A   |   | 3/1999  | Lee |
| 6,566,920 | B1  |   | 5/2003  | Kim |
| 6,646,477 | B1  |   | 11/2003 | Xin-LeBlanc |
| 7,084,670 | B1  |   | 8/2006  | Chiu |
| 7,102,448 | B2  |   | 9/2006  | Chou et al. |
| 2002/0060946 | A1 | * | 5/2002 | Noh et al. .......... 365/233 |
| 2005/0218948 | A1 | * | 10/2005 | Zhu et al. .......... 327/157 |
| 2005/0242843 | A1 | * | 11/2005 | Meltzer et al. .......... 327/47 |
| 2007/0257709 | A1 | * | 11/2007 | Han et al. .......... 327/39 |
| 2008/0100385 | A1 | * | 5/2008 | Lin .......... 331/16 |

FOREIGN PATENT DOCUMENTS

| EP | 1843472 A1 * | 10/2007 |
| JP | 2007-189404 | 7/2007 |
| KR | 100210915 B1 | 4/1999 |
| KR | 1020030088570 A | 11/2003 |
| KR | 1020050099307 A | 10/2005 |
| KR | 1020060088415 A | 8/2006 |

* cited by examiner

*Primary Examiner* — Kevin M Burd
(74) *Attorney, Agent, or Firm* — Baker & McKenzie LLP

(57) ABSTRACT

A phase detection circuit includes a phase frequency detector for comparing a first input signal and a second input signal and outputting a first phase comparison signal and a second phase comparison signal, and a sensing circuit for sensing a pulse width difference between the first phase comparison signal and the second phase comparison signal and outputting phase detection signals which have different logic values.

22 Claims, 4 Drawing Sheets

PHASE DETECTION CIRCUIT

CROSS-REFERENCE TO RELATED PATENT APPLICATION

This application claims the benefit under 35 U.S.C. 119(a) of Korean Patent Application No. 10-2007-0080621, filed on Aug. 10, 2007, in the Korean Intellectual Property Office, the disclosure of which is incorporated herein in its entirety by reference as if set forth in full.

BACKGROUND

1. Technical Field

The embodiments described herein relate to semiconductor circuit technologies, and more particularly, to a phase detection circuit that is used in a system requiring a phase comparison result.

2. Related Art

A conventional phase detection circuit can be configured using a flip-flop or a phase frequency detector. For example, referring to FIG. 1, a conventional phase detection circuit using a flip-flop includes a D flip-flop DFF and an inverter IV1.

The D flip-flop DFF is configured to receive a reference clock signal 'REFCLK' through the input terminal thereof and a feedback clock signal 'FBCLK' through the clock terminal thereof and to output an up signal 'UP' and a down signal 'DN' obtained by inverting the up signal 'UP' through the inverter IV1.

The feedback clock signal 'FBCLK' is a clock signal that is compared with the reference clock signal 'REFCLK' in a system using a phase detection circuit, for example, a locked loop circuit such as a DLL (delay locked loop) circuit or a PLL (phase locked loop) circuit.

If the phase of the reference clock signal 'REFCLK' is faster than the feedback clock signal 'FBCLK', as shown in FIG. 2a, the phase detection circuit of FIG. 1 outputs the up signal 'UP' at a high level. If the phase of the reference clock signal 'REFCLK' is slower than the feedback clock signal 'FBCLK', as shown in FIG. 2b, the phase detection circuit of FIG. 1 outputs the down signal 'DN' at a high level.

The phase detection circuit shown in FIG. 1 has two drawbacks. First, the phase detection circuit has a dead zone. That is to say, since the phase detection circuit has a low resolution, it cannot detect a phase difference below a certain level. The dead zone is directly associated with the setup and hold times of the flip-flop and may cause jitter in a system using the phase detection circuit.

Second, the phase detection circuit has a limited phase detection range. That is to say, the initial phase difference between two signals to be detected in the phases thereof must be in the range of $\pi$~$2\pi$. If the initial phase difference is out of the range, an operation error can be caused in the system using the phase detection circuit shown in FIG. 1.

Therefore, in the system using the phase detection circuit shown in FIG. 1, a separate circuit must be added to make the phase difference between the two signals received by the phase detection circuit at an initial operation stage to be in the predefined range.

In a conventional phase detection circuit using a phase frequency detector, since the phase detection circuit has linear operation characteristics and both of an up signal 'UP' and a down signal 'DN' are output in short pulses, it is difficult to apply the phase detection circuit to a digital control type locked loop circuit.

For this reason, the phase detection circuit using a phase frequency detector has a limit in an application range in that the phase detection circuit must be configured together with a charge pump in an analog control type locked loop circuit, and the size of the phase detection circuit increases due to the presence of an additional circuit.

SUMMARY

A phase detection circuit that is not limited in a phase detection range and can operate stably without an additional circuit is described herein.

According to one aspect, a phase detection circuit comprises a phase frequency detector configured to compare a first input signal and a second input signal and output a first phase comparison signal and a second phase comparison signal, and a sensing circuit configured to sense a pulse width difference between the first phase comparison signal and the second phase comparison signal and output phase detection signals that have different logic values.

According to another aspect, a phase detection circuit comprises a phase frequency detector configured to compare a first input signal and a second input signal and output a first phase comparison signal and a second phase comparison signal, a sensing circuit configured to sense a pulse width difference between the first phase comparison signal and the second phase comparison signal and output phase detection signals that have different logic values, for activation ranges that are set to be different for different operation modes, and a control circuit configured to control the activation ranges of the sensing circuit in response to an operation mode signal.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DESCRIPTION OF SPECIFIC EMBODIMENTS

Figure 1:
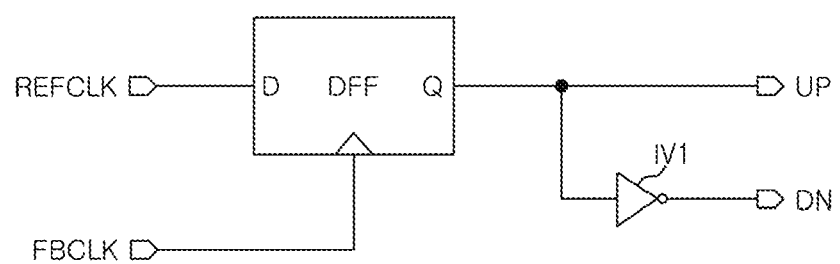
FIG. 1 is a block diagram of an exemplary phase detection circuit.
Figure 2A:
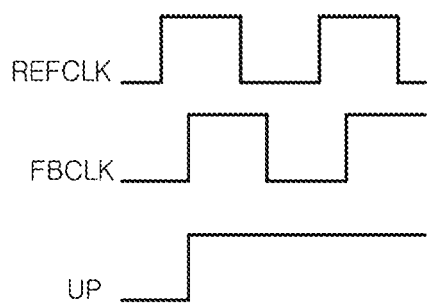
FIGS. 2a and 2b are timing diagrams illustrating the operation of the phase detection circuit of FIG. 1.
Figure 2B:
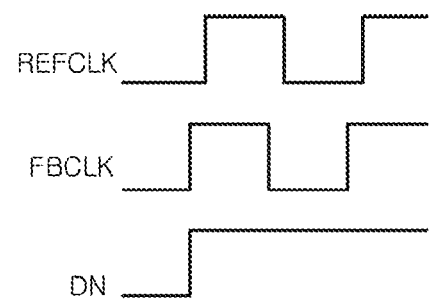

Wherever possible, in the following description, the same reference numerals will be used throughout the drawings and the description to refer to the same or like parts.

Figure 3:
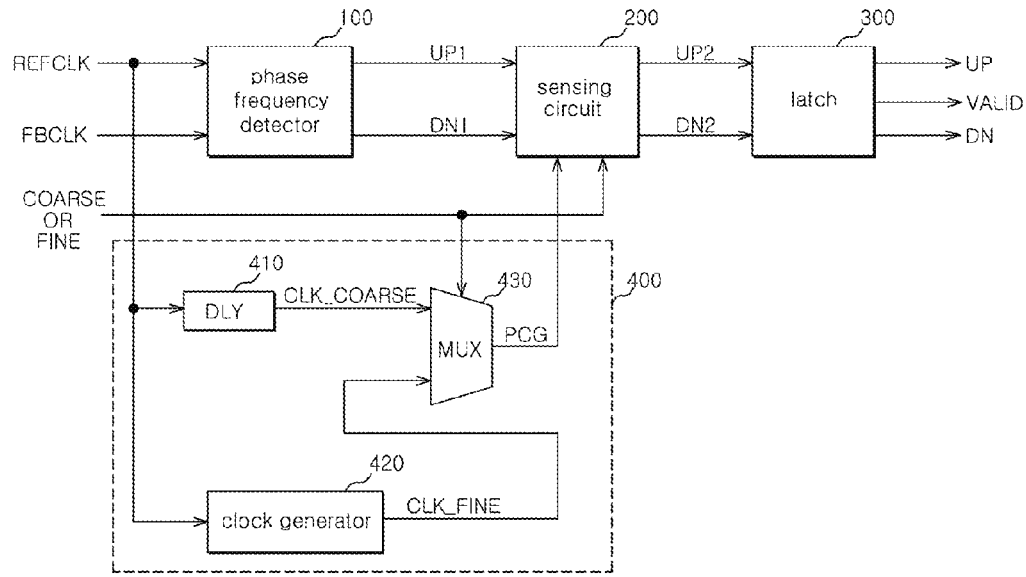
FIG. 3 is a block diagram of a phase detection circuit in accordance with one embodiment.

FIG. 3 is a diagram illustrating an example phase detection circuit 101 configured in accordance with one embodiment. Referring to FIG. 3, the phase detection circuit 101 can include a phase frequency detector 100, a sensing circuit 200, a latch 300, and a control circuit 400.

The phase frequency detector 100 can be configured to compare the phases of a reference clock signal 'REFCLK' and a feedback clock signal 'FBCLK' with each other and output phase comparison signals 'UP1' and 'DN1'.

The sensing circuit 200 can be configured to sense the levels of the phase comparison signals 'UP1' and 'DN1' in response to an operation mode signal 'COARSE OR FINE' and a precharge signal 'PCG' and output sensing signals 'UP2' and 'DN2'. The operation mode signal 'COARSE OR FINE' can be a signal for adjusting the operation mode of the sensing circuit 200. In conformity with the level of the operation mode signal 'COARSE OR FINE', the sensing circuit 200 can operate in a coarse mode, or in a fine mode in which sensing operation is finely implemented when compared to the coarse mode.

The latch 300 can be configured to latch the sensing signals 'UP2' and 'DN2'.

The control circuit 400 can be configured to change the frequency of the precharge signal 'PCG' using the reference clock signal 'REFCLK' and the operation mode signal 'COARSE OR FINE'.

Figure 4:
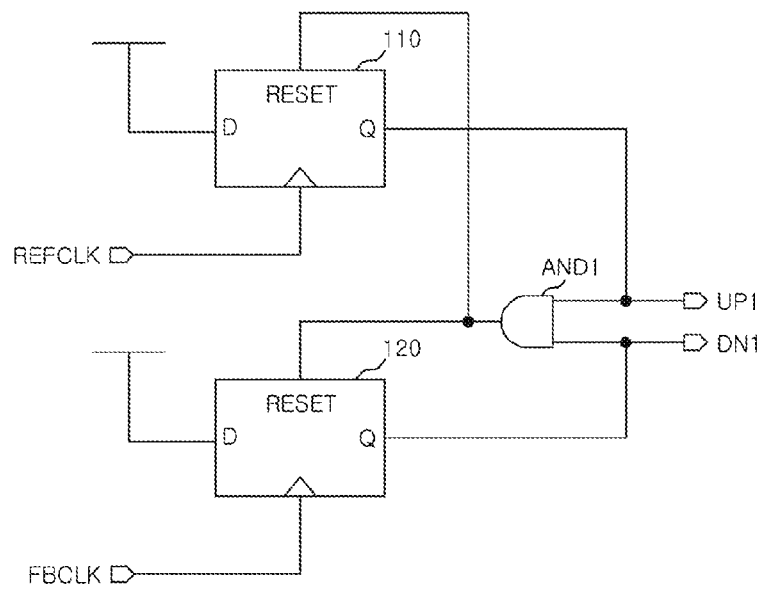
FIG. 4 is a circuit diagram of a phase frequency detector that can be included in the circuit shown in FIG. 3.

Referring to FIG. 4, it can be seen that the phase frequency detector 100 can include a first flip-flop 110, a second flip-flop 120, and an AND gate AND1.

The first flip-flop 110 can be configured to receive power through the input terminal D thereof and the reference clock signal 'REFCLK' through the clock input terminal thereof. The second flip-flop 120 can be configured to receive power through the input terminal D thereof and the feedback clock signal 'FBCLK' through the clock input terminal thereof. The AND gate AND1 ANDs the outputs of the first and second flip-flops 110 and 120 and applies an ANDing result value to the reset terminals RESET of the first and second flip-flops 110 and 120.

Figure 5:
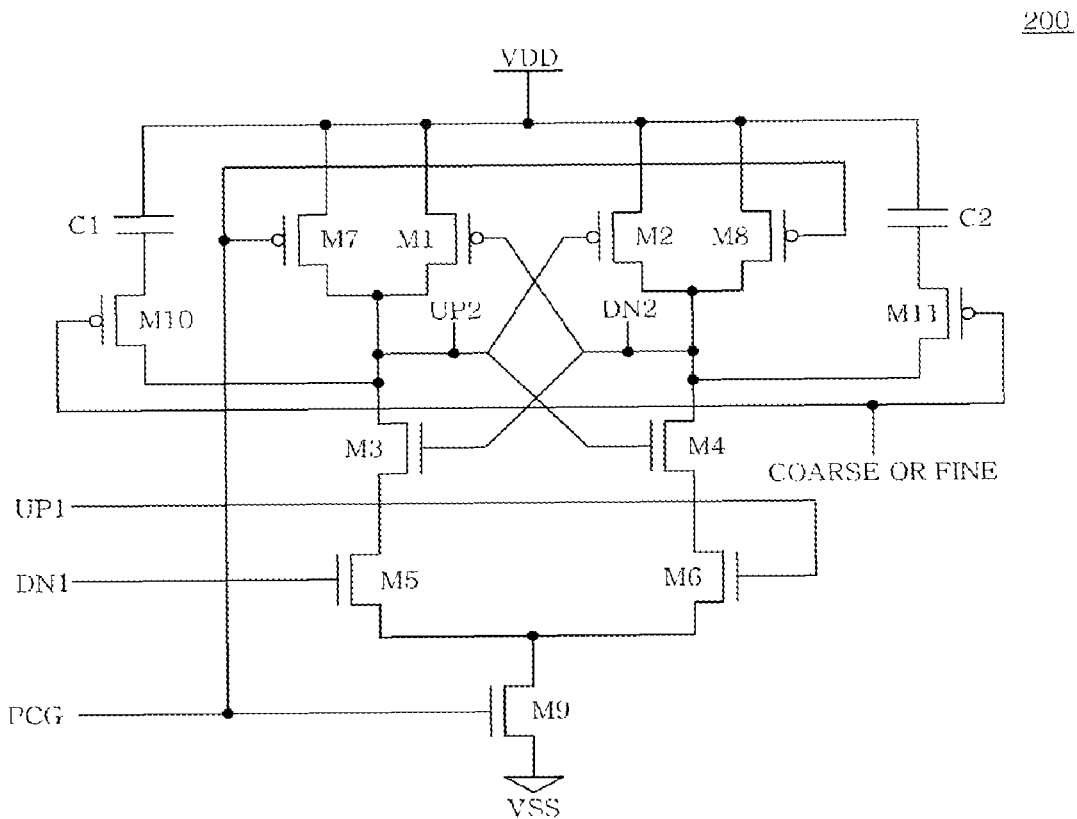
FIG. 5 is a circuit diagram of a sensing circuit that can be included in the circuit shown in FIG. 3.

Referring to FIG. 5, the sensing circuit 200 can include a sense amplifier, and an additional circuit for changing the operation mode of the sense amplifier to the coarse mode or to the fine mode in response to the operation mode signal 'COARSE OR FINE'.

The sense amplifier can comprise a cross-coupled latch. The cross-coupled latch can include first through sixth transistors M1 through M6. The additional circuit can include seventh through eleventh transistors M7 through M11 and first and second capacitors C1 and C2. The seventh through ninth transistors M7 through M9 can be configured to convert the sense amplifier into a precharge state in response to the precharge signal 'PCG'. The tenth and eleventh transistors M10 and M11 and the first and second capacitors C1 and C2 can be configured to operate as a filter for changing the operation mode of the sense amplifier to the coarse mode or to the fine mode in response to the operation mode signal 'COARSE OR FINE'.

Figure 6:
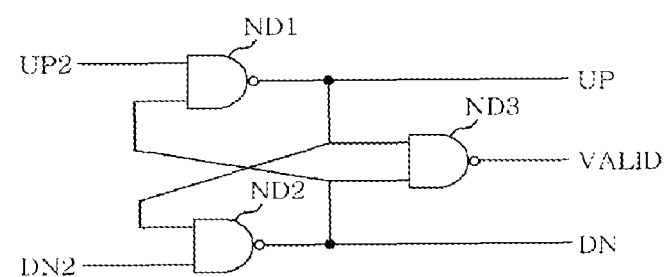
FIG. 6 is a circuit diagram of a latch that can be included in the circuit shown in FIG. 3.

Referring to FIG. 6, the latch 300 can include first through third NAND gates ND1 through ND3.

The first NAND gate ND1 can be configured to receive the sensing signal 'UP2' through the first input terminal thereof and output a phase detection signal 'UP' through the output terminal thereof. The second NAND gate ND2 can be configured to receive the phase detection signal 'UP' through the first input terminal thereof and the sensing signal 'DN2' through the second input terminal thereof and output a phase detection signal 'DN' through the output terminal thereof. The phase detection signal 'DN' can be received by the second input terminal of the first NAND gate ND1. The third NAND gate ND3 can be configured to receive the phase detection signals 'UP' and 'DN' through the first and second input terminals thereof and output a valid signal 'VALID' through the output terminal thereof.

Referring to FIG. 3, the control circuit 400 can include a delay (DLY) 410, a clock generator 420, and a multiplexer (MUX) 430.

The delay (DLY) 410 can be configured to receive the reference clock signal 'REFCLK', delay the reference clock signal 'REFCLK' for a preset time and output a first clock signal 'CLK_COARSE'.

The clock generator 420 can be configured to receive the reference clock signal 'REFCLK' and output a second clock signal 'CLK_FINE', which corresponds to N division (for example, N=5), and an inversion of the first clock signal 'CLK_COARSE'.

The multiplexer 430 can be configured to select and output one of the first clock signal 'CLK_COARSE' and the second clock signal 'CLK_FINE' in response to the operation mode signal 'COARSE OR FINE'.

Figure 7:
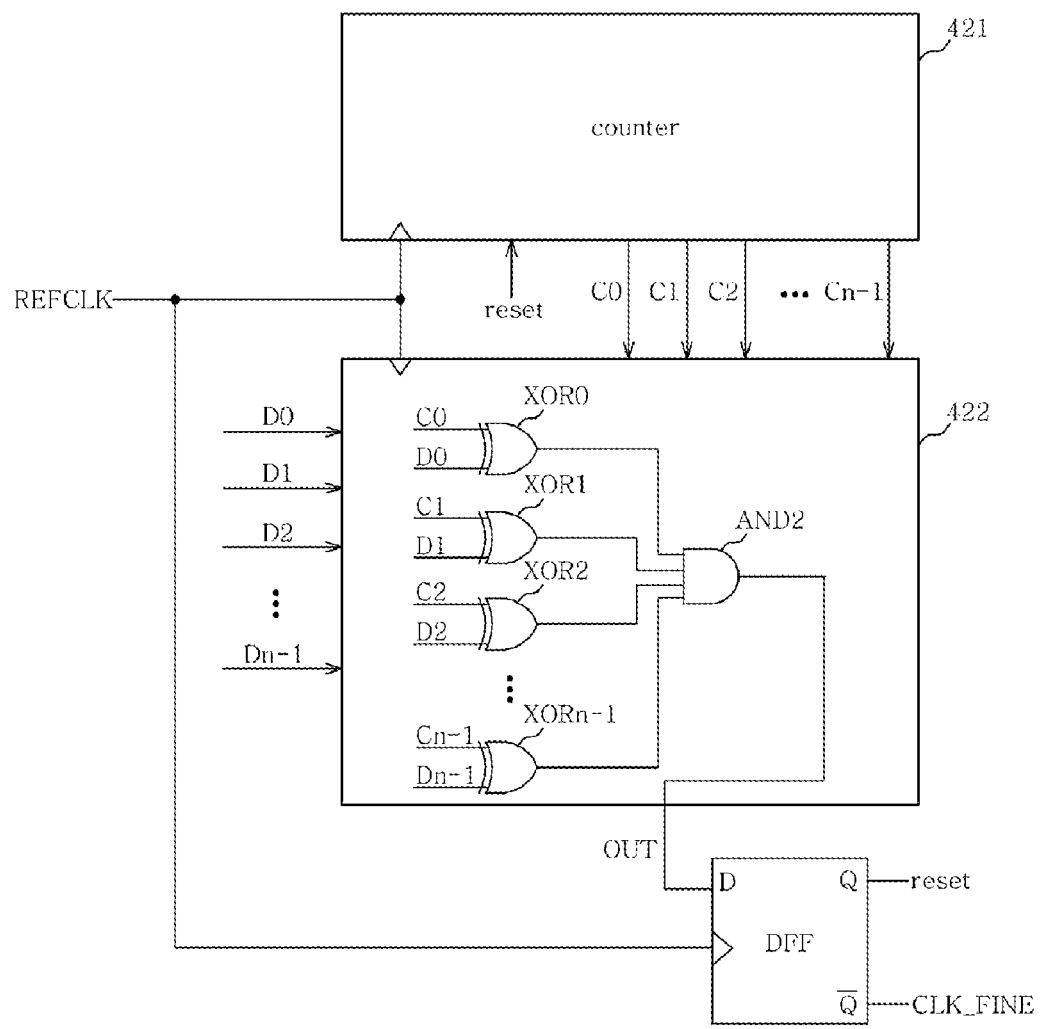
FIG. 7 is a circuit diagram of a clock generator that can be included in the circuit shown in FIG. 3.

Referring to FIG. 7, the clock generator 420 can include a counter 421, a matching circuit 422 and a flip-flop DEF.

The counter 421 can be configured to count the reference clock signal 'REFCLK' and output counting data C0 through Cn−1. The counting data C0 through Cn−1 of the counter 421 can be initialized in response to a reset signal 'reset'.

The matching circuit 422 can be configured to activate a matching signal 'OUT' when the counting data C0 through Cn−1 are equal to the reference data D0 through Dn−1. The matching circuit 422 can include a plurality of XOR gates XOR1 through XORn−1 each of which can receive one bit of the counting data C0 through Cn−1 and one bit of the reference data D0 through Dn−1, and an AND gate AND2, which ANDs the outputs of the plurality of XOR gates XOR1 through XORn−1 and outputs the ANDing result value as the matching signal 'OUT'.

The flip-flop DEF can be configured to output the match signal 'OUT', received through the input terminal D thereof, through the output terminal Q thereof as a reset signal 'reset' in response to the reference clock signal 'REFCLK'. The flip-flop DEF can be configured to output the second clock signal 'CLK_FINE', which corresponds to the inversion of the reset signal 'reset', through the inversion terminal /Q thereof.

The operations of the clock generator 420 will be described below.

First, the counter 421 starts counting in synchronism with the reference clock signal 'REFCLK', and corresponding counting data C0 through Cn−1 are received by the matching circuit 422. When the counting data C0 through Cn−1 are equal to the reference data D0 through Dn−1, the matching circuit 422 outputs the matching signal 'OUT' at a high level. When the matching signal 'OUT' has a high level, the flip-flop DEF outputs the reset signal 'reset' at a high level and the second clock signal 'CLK_FINE' corresponding to the inversion of the reset signal 'reset'. For example, assuming that the reference data D0 through Dn−1 are three bits '110', when the counting data C0 through Cn−1 become '110', the reset signal 'reset' is output as a high level pulse. The reset signal 'reset' can be a signal that has a duty ratio of 1/5 and corresponds to 5 division of the reference clock signal 'REFCLK'. Since the second clock signal 'CLK_FINE' corresponds to the inversion of the reset signal 'reset', it has a duty ratio of 4/5 and corresponds to 5 division of the reference clock signal 'REFCLK'.

Hereafter, the operations of the phase detection circuit, constructed as mentioned above, will be described.

First, the phase frequency detector 100 receives the reference clock signal 'REFCLK' and the feedback clock signal 'FBCLK' and, by comparing the phases of the clock signals from 0° to 360°, outputs phase comparison signals 'UP1' and 'DN1'.

The phase comparison signals 'UP1' and 'DN1' can have a pulse width difference that corresponds to the phase difference between the reference clock signal 'REFCLK' and the feedback clock signal 'FBCLK'.

A locked loop circuit, to which the phase detection circuit 101 is applied, for example a DLL (delay locked loop) circuit, can operate in two operation modes (including the coarse mode and the fine mode). The two operation modes of the DLL circuit can be selectively implemented. Between the operation modes of the DLL circuit, the coarse mode is mainly used to rapidly decrease the phase difference between the two input clock signals when the phase difference is substantial in the initial stage of the DLL circuit operation, and the fine mode is used to finely adjust the phase difference between the two input clock signals when the phase difference is within a predetermined range. Accordingly, the phase detection circuit 101 can be constructed to support the two operation modes of the DLL circuit.

It is assumed that the operation mode signal 'COARSE OR FINE' has a high level in the case of the coarse mode and a low level in the case of the fine mode.

The control circuit 400 selects the first clock signal 'CLK_COARSE' and outputs the corresponding precharge signal 'PCG' when the operation mode signal 'COARSE OR FINE' has a high level. The control circuit 400 selects the second clock signal 'CLK_FINE' and outputs the corresponding precharge signal 'PCG' when the operation mode signal 'COARSE OR FINE' has a low level.

The sensing circuit 200 operates in the coarse mode when the operation mode signal 'COARSE OR FINE' has a high level. In the sensing circuit 200, if the operation mode signal 'COARSE OR FINE' has a high level, then the tenth and eleventh transistors M10 and M11 are turned off. Because the tenth and eleventh transistors M10 and M11 are turned off, current flow to the first and second capacitors C1 and C2 is intercepted. The sensing circuit 200 repeats sensing and precharging operations in response to the precharge signal 'PCG', which has the period of the first clock signal 'CLK_COARSE'.

In the case where the precharge signal 'PCG' is deactivated at a high level, since the ninth transistor M9 is turned on, the sensing signals 'UP2' and 'DN2', obtained by amplifying the pulse width difference between the phase comparison signals 'UP1' and 'DN1', are output. Any one of the sensing signals 'UP2' and 'DN2' has a high level, and the other has a low level. In the case where the precharge signal 'PCG' is activated at a low level, since the ninth transistor M9 is turned off and the seventh and eighth transistors M7 and M8 are turned on, the sensing signals 'UP2' and 'DN2' have the same level as the power source VDD. That is to say, in the coarse mode, the sensing circuit 200 implements sensing operation every time a rising edge occurs in the reference clock signal 'REFCLK'.

The sensing circuit 200 operates in the fine mode when the operation mode signal 'COARSE OR FINE' has a low level. In the sensing circuit 200, if the operation mode signal 'COARSE OR FINE' has a low level, then the tenth and eleventh transistors M10 and M11 are turned on. Because the tenth and eleventh transistors M10 and M11 are turned on, current flows to the first and second capacitors C1 and C2 in conformity with the levels of the phase comparison signals 'UP1' and 'DN1'. The sensing circuit 200 repeats sensing and precharging operations in response to the precharge signal 'PCG', which has the period of the second clock signal 'CLK_FINE'.

In the case where the precharge signal 'PCG' is deactivated at a high level, since the ninth transistor M9 is turned on, the sensing signals 'UP2' and 'DN2', obtained by amplifying the pulse width difference between the phase comparison signals 'UP1' and 'DN1', are outputted. Since the precharge signal 'PCG' has the period of the second clock signal 'CLK_FINE', that is, the period corresponding to 5 division of the reference clock signal 'REFCLK', current, corresponding to the phase comparison signals 'UP1' and 'DN1', which are detected while the rising edge of the reference clock signal 'REFCLK' occurs N times (for example, 5 times), charges the first and second capacitors C1 and C2.

The charged voltage levels of the first and second capacitors C1 and C2 are output as the sensing signals 'UP2' and 'DN2'.

In the case where the precharge signal 'PCG' is activated at a low level, since the ninth transistor M9 is turned off and the seventh and eighth transistors M7 and M8 are turned on, the sensing signals 'UP2' and 'DN2' have the same level as the power source VDD. That is to say, in the fine mode, the sensing circuit 200 outputs the sensing signals 'UP2' and 'DN2' by integrating the sensing results obtained while the rising edge occurs N times in the reference clock signal 'REFCLK'. The first and second capacitors C1 and C2 operate as filters for integrating the sensing result values as the sensing circuit 200 implements the sensing operation N times.

The latch 300 maintains the levels of the sensing signals 'UP2' and 'DN2' and finally outputs the phase detection signals 'UP' and 'DN'.

Referring to FIG. 6, in the initial operation stage, since both the sensing signals 'UP2' and 'DN2' have a low level, both the phase detection signals 'UP' and 'DN' can have a high level. In the case where both the phase detection signals 'UP' and 'DN' have a high level, they become invalid output values. When the phase detection signals 'UP' and 'DN' have normal levels, that is, have different levels, the latch 300 activates the valid signal 'VALID' to a high level. If the valid signal 'VALID' is activated at a high level, then a circuit after the phase detection circuit can determine that the phase detection signals 'UP' and 'DN' are valid and operate normally.

The latch 300 maintains the levels of the preceding phase detection signals 'UP' and 'DN' during the precharge period of the sensing circuit 200.

In the phase detection circuit 101, since a phase frequency detection scheme is used, there is no limit in a phase detection range. Further, in the phase detection circuit 101, because there is no limit in a phase detection range, an additional circuit for making a phase difference between initially inputted signals to be in a predefined range is not necessary. Still further, in the phase detection circuit 101, due to the fact that a phase detection pulse is converted into a digital signal through a sensing circuit, the phase detection circuit can be easily applied to a digital control type locked loop circuit. Still further, in the phase detection circuit 101, as a digital filter is included therein, precise phase detection is possible, and the size of a locked loop circuit using the phase detection circuit can be decreased.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A phase detection circuit comprising:
a phase frequency detector configured to compare a first input signal and a second input signal and output a first phase comparison signal and a second phase comparison signal; and
a sensing circuit configured to select, as an output, a sensing result or an integration value of a plurality of the sensing result based on an operation mode signal, wherein
the sensing result is generated by sensing a pulse width difference between the first phase comparison signal and the second phase comparison signal,
the phase detection circuit is configured to support a coarse mode and a fine mode of a Delay Locked Loop circuit, and
the operation mode signal defines one mode of the coarse mode and the fine mode.

2. The phase detection circuit according to claim 1, wherein the phase frequency detector comprises:
a first flip-flop configured to output a power source level in response to the first input signal; and
a second flip-flop configured to output a power source level in response to the second input signal.

3. The phase detection circuit according to claim 2, wherein the phase frequency detector further comprises:
a logic element configured to AND an output of the first flip-flop and an output of the second flip-flop and reset the first flip-flop and the second flip-flop using the AND result.

4. The phase detection circuit according to claim 1, wherein the sensing circuit comprises a sense amplifier configured to receive the first phase comparison signal and the second phase comparison signal.

5. The phase detection circuit according to claim 4, wherein the sense amplifier comprises a cross-coupled latch.

6. The phase detection circuit according to claim 4, wherein the sensing circuit further comprises:
a first switching element connected between a power terminal and an output terminal of the sense amplifier and operating in response to a precharge signal for precharging an output of the sense amplifier to a preset level; and
a second switching element connected between a ground terminal and the sense amplifier and operating in response to the precharge signal.

7. The phase detection circuit according to claim 4, wherein the sensing circuit further comprises a filter configured to integrate sensing result values of the sense amplifier.

8. The phase detection circuit according to claim 7, wherein the filter comprises:
capacitors connected to a power terminal of the sense amplifier; and
switches connected between the capacitors and the output terminal of the sense amplifier and operating in response to an operation mode signal.

9. The phase detection circuit according to claim 1, further comprising a latch configured to maintain an output level of the sensing circuit.

10. The phase detection circuit according to claim 1, further comprising a control circuit configured to vary a sensing period of the sensing circuit in response to an operation mode signal.

11. The phase detection circuit according to claim 10, wherein the control circuit comprises:

a clock generator configured to output a duty ratio changing signal, which has a duty ratio different from that of the first input signal, using the first input signal; and
a multiplexer configured to selectively output one of the duty ratio changing signal and a delay signal, which is obtained by delaying the first input signal, in response to the operation mode signal.

12. The phase detection circuit according to claim 11, wherein the clock generator comprises:
a counter configured to output counting data in synchronization with the first input signal;
a matching circuit configured to determine whether the counting data correspond to reference data and output a matching signal, in synchronization with the first input signal; and
a flip-flop configured to output a reset signal for resetting the counter and the duty ratio changing signal using an output of the matching circuit.

13. The phase detection circuit according to claim 12, wherein the matching circuit comprises:
a plurality of first logic elements each configured to receive one bit of the counting data and one bit of the reference data; and
a second logic element configured to AND outputs of the plurality of first logic elements and output the matching signal using the AND result.

14. The phase detection circuit according to claim 10, wherein the operation mode signal determines operation modes of the sensing circuit as a coarse mode, or as a fine mode in which sensing operation is finely implemented when compared to the coarse mode.

15. A phase detection circuit comprising:
a phase frequency detector configured to compare a first input signal and a second input signal and output a first phase comparison signal and a second phase comparison signal;
a sensing circuit configured to select, as an output a sensing result or an integration value of a plurality of the sensing result based on an operation mode signal, wherein the sensing result is generated by sensing a pulse width difference between the first phase comparison signal and the second phase comparison signal, and the output of the sensing circuit is precharged in response to a precharge signal; and
a control circuit configured to vary a sensing period of the sensing circuit in response to the operation mode signal, wherein
the phase detection circuit is configured to support a coarse mode and a fine mode of a Delay Locked Loop circuit, and
the operation mode signal defines one mode of the coarse mode and the fine mode.

16. The phase detection circuit according to claim 15, wherein the sensing circuit comprises:
a sense amplifier configured to sense the pulse width difference between the first phase comparison signal and the second phase comparison signal in synchronization with the first input signal; and
a filter configured to integrate sensing result values of the sense amplifier and output the phase detection signals.

17. The phase detection circuit according to claim 16, wherein the sensing circuit further comprises:
a first switching element connected between a power terminal and an output terminal of the sense amplifier and operating in response to a precharge signal for precharging an output of the sense amplifier to a preset level; and a second switching element connected between a ground terminal and the sense amplifier and operating in response to the precharge signal.

18. The phase detection circuit according to claim 16, wherein the filter comprises:
   capacitors connected to a power terminal of the sense amplifier; and
   switches connected between the capacitors and the output terminal of the sense amplifier.

19. The phase detection circuit according to claim 15, wherein the control circuit comprises:
   a clock generator configured to output a duty ratio changing signal, which has a duty ratio different from that of the first input signal, using the first input signal; and
   a multiplexer configured to selectively output one of the duty ratio changing signal and a delay signal which is obtained by delaying the first input signal, in response to the operation mode signal.

20. The phase detection circuit according to claim 19, wherein the clock generator comprises:
   a counter configured to output counting data in synchronization with the first input signal;
   a matching circuit configured to determine whether the counting data correspond to reference data and output a matching signal, in synchronization with the first input signal; and
   a flip-flop configured to output a reset signal for resetting the counter and the duty ratio changeable signal using an output of the matching circuit.

21. The phase detection circuit according to claim 20, wherein the matching circuit comprises:
   a plurality of first logic elements each configured to receive one bit of the counting data and one bit of the reference data; and
   a second logic element configured to AND outputs of the plurality of first logic elements and output the matching signal using the ANDing result.

22. The phase detection circuit according to claim 15, wherein the operation mode signal determines operation modes of the sensing circuit as a coarse mode, or as a fine mode in which sensing operation is finely implemented when compared to the coarse mode.

* * * * *